(12) United States Patent
Shin et al.

(10) Patent No.: US 11,602,091 B2
(45) Date of Patent: Mar. 7, 2023

(54) ELECTROMAGNETIC WAVE SHIELDING FILM

(71) Applicant: LG CHEM, LTD., Seoul (KR)

(72) Inventors: Jong Min Shin, Daejeon (KR); Dong Woo Yoo, Daejeon (KR); Jin Kyu Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 112 days.

(21) Appl. No.: 17/251,865

(22) PCT Filed: Jun. 28, 2019

(86) PCT No.: PCT/KR2019/007898
§ 371 (c)(1),
(2) Date: Dec. 14, 2020

(87) PCT Pub. No.: WO2020/005013
PCT Pub. Date: Jan. 2, 2020

(65) Prior Publication Data
US 2021/0259143 A1    Aug. 19, 2021

(30) Foreign Application Priority Data
Jun. 29, 2018 (KR) .................. 10-2018-0075962

(51) Int. Cl.
*H05K 9/00* (2006.01)
*B05D 1/18* (2006.01)

(52) U.S. Cl.
CPC ............ *H05K 9/0084* (2013.01); *B05D 1/18* (2013.01)

(58) Field of Classification Search
CPC .................................................. H05K 9/0086
See application file for complete search history.

(56) References Cited

U.S. PATENT DOCUMENTS

| | | | |
|---|---|---|---|
| 5,895,726 A | 4/1999 | Imam et al. | |
| 8,415,568 B1* | 4/2013 | Hansen | H05K 9/0088 174/394 |
| 2012/0286190 A1* | 11/2012 | Prat | C04B 28/16 252/62 |
| 2014/0116661 A1 | 5/2014 | Xu et al. | |
| 2016/0165766 A1 | 6/2016 | Chen et al. | |

(Continued)

FOREIGN PATENT DOCUMENTS

| | | |
|---|---|---|
| CN | 106061103 A | 10/2016 |
| CN | 106750284 A | 5/2017 |
| EP | 3683046 A1 | 7/2020 |

(Continued)

OTHER PUBLICATIONS

Extended European Search Report corresponding to EP 19827022.5 dated Jul. 19, 2021 (12 pages).

(Continued)

*Primary Examiner* — Hung V Ngo
(74) *Attorney, Agent, or Firm* — Myers Bigel, P.A.

(57) ABSTRACT

The present application relates to an electromagnetic wave shielding film, which can provide an electromagnetic wave shielding film having excellent mechanical strength, flexibility, electrical insulation properties, bonding properties with other constituents, oxidation and high-temperature stability and the like, while having excellent electromagnetic shielding ability.

15 Claims, 1 Drawing Sheet

(56) References Cited

U.S. PATENT DOCUMENTS

2018/0162098 A1    6/2018  Joo

FOREIGN PATENT DOCUMENTS

| JP | H05309780 A | 11/1993 |
| JP | 4308328 B2 | 8/2009 |
| JP | 2011214082 A | 10/2011 |
| JP | 2014534645 A | 12/2014 |
| KR | 200338459 Y1 | 1/2004 |
| KR | 20080021891 A | 3/2008 |
| KR | 20130075414 A | 7/2013 |
| KR | 20140065325 A | 5/2014 |
| KR | 20170029375 A | 3/2017 |
| KR | 20170086286 A | 7/2017 |

OTHER PUBLICATIONS

International Search Report corresponding to PCT/KR2019/007898; dated Sep. 27, 2019 (5 pages, including English translation).

* cited by examiner

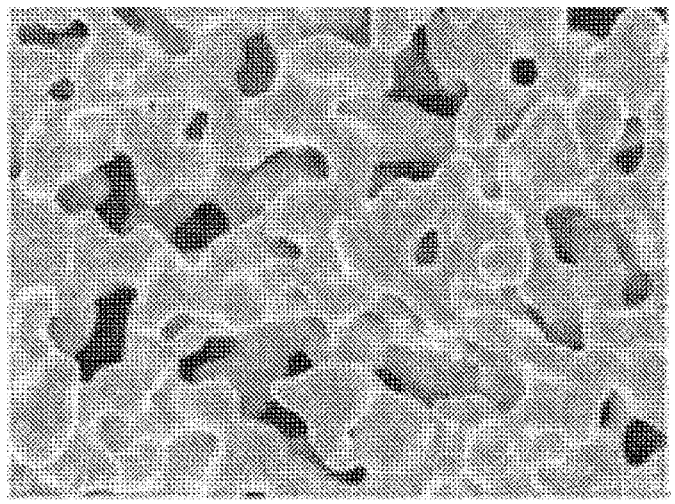

ELECTROMAGNETIC WAVE SHIELDING FILM

CROSS REFERENCE TO RELATED APPLICATIONS

This application is a 35 U.S.C. § 371 national stage application of PCT International Application No. PCT/KR2019/007898, filed Jun. 28, 2019, which claims priority from Korean Patent Application No. 10-2018-0075962, filed Jun. 29, 2018, the contents of which are incorporated herein in their entireties by reference. The above-referenced PCT International Application was published in the Korean language as International Publication No. WO2020/005013 on Jan. 2, 2020.

TECHNICAL FIELD

The present application relates to an electromagnetic wave shielding film.

BACKGROUND ART

There are various problems caused by electromagnetic waves generated in various electronic devices. The electromagnetic waves emitted to the outside have a bad influence on health, as well as cause signal disturbance or malfunction problems for the electronic device itself or other devices including the electronic device.

DISCLOSURE

Technical Problem

The present application relates to an electromagnetic wave shielding film. It is one object of the present application to provide an electromagnetic wave shielding film having excellent electromagnetic shielding ability, having good mechanical strength, electrical insulation and flexibility, and having excellent stability against oxidation and high temperature.

Technical Solution

Among physical properties referred to in this specification, the physical properties that the measurement temperature and/or the measurement pressure affect the results are the results measured at room temperature and/or normal pressure, unless otherwise specified.

The term room temperature is a natural temperature without warming or cooling, which means, for example, any one temperature in a range of 10° C. to 30° C., or a temperature of 23° C. or about 25° C. or so. Also, in this specification, the unit of temperature is Celsius (° C.), unless otherwise specified.

The term normal pressure is a natural pressure without pressurizing or depressurizing, which means, usually, about 1 atm or so of atmospheric pressure.

In this specification, in the case of physical properties in which the measurement humidity affects the results, the relevant physical properties are the physical properties measured at natural humidity which is not particularly controlled at the room temperature and/or normal pressure state.

The present application relates to an electromagnetic wave shielding film. The electromagnetic wave shielding film of the present application may comprise a metal foam and a polymer component. By unique surface area and pore characteristics of the metal foam, the electromagnetic wave shielding film can repetitively reflect and absorb electromagnetic waves incident on the inner pores, thereby effectively extinguishing the electromagnetic waves.

Accordingly, the electromagnetic wave shielding film can exhibit excellent electromagnetic wave shielding ability. For example, the electromagnetic wave shielding film may have an electromagnetic wave shielding efficiency of 85 dB or more at 100 kHz to 3 GHz in accordance with ASTM D4935 or ASTM ES7 standard. In another example, the efficiency may be about 86 dB or more, 87 dB or more, 88 dB or more, 89 dB or more, 90 dB or more, 91 dB or more, 92 dB or more, 93 dB or more, 94 dB or more, or 95 dB or more or so. The upper limit of the efficiency is not particularly limited, but the electromagnetic wave shielding efficiency at 100 kHz to 3 GHz according to the ASTM D4935 or ASTM ES7 standard may be, for example, about 200 dB or less, 190 dB or less, 180 dB or less, 170 dB or less, 160 dB or less, 150 dB or less, 140 dB or less, 130 dB or less, 120 dB or less, 100 dB or less, or 100 dB or less or so.

In addition, the electromagnetic wave shielding film may have an electromagnetic wave shielding efficiency of 70 dB or more at 1.5 to 18 GHz according to ASTM D4935 or ASTM ES7 standard. In another example, the electromagnetic shielding efficiency may be 71 dB or more, 72 dB or more, 73 dB or more, 74 dB or more, 75 dB or more, 76 dB or more, 77 dB or more, 78 dB or more, 79 dB or more, 80 dB or more, 81 dB or more, 82 dB or more, 83 dB or more, 84 dB or more, or 85 dB or more, or may be about 200 dB or less, 190 dB or less, 180 dB or less, 170 dB or less, 160 dB or less, 150 dB or less, 140 dB or less, 130 dB or less, 120 dB or less, 100 dB or less, or 100 dB or less or so.

In addition, the composite material of the present application can be provided with a metal foam to ensure excellent mechanical strength and flexibility, and can also solve oxidation and high-temperature stability, or a peeling problem to occur when has been included in a device, and the like, while ensuring excellent electrical insulation by compounding with the polymer component.

In this specification, the term metal foam or metal skeleton means a porous structure including a metal as a main component. Here, the inclusion of a metal as a main component means a case where the ratio of the metal is 55 wt % or more, 60 wt % or more, 65 wt % or more, 70 wt % or more, 75 wt % or more, 80 wt % or more, 85 wt % or more, 90 wt % or more, or 95 wt % or more, based on the total weight of the metal foam or the metal skeleton. The upper limit of the ratio of the metal included as the main component is not particularly limited, which may be, for example, about 100 wt %, 99 wt % or 98 wt % or so.

In this specification, the term porousness may mean a case where it has a porosity of at least 10% or more, 20% or more, 30% or more, 40% or more, 50% or more, 60% or more, 70% or more, 75% or more, or 80% or more. The upper limit of the porosity is not particularly limited, which may be, for example, less than about 100%, about 99% or less, about 98% or less, about 95% or less, about 90% or less, about 85% or less, about 80% or less, or about 75% or less or so. The porosity can be calculated in a known manner by calculating the density of the metal foam or the like.

By controlling the pore size of such a porous metal foam, the performance of the electromagnetic wave shielding film can be improved. For example, it may be advantageous in terms of securing the electromagnetic wave shielding ability to apply a metal foam, in which 55% or more, 60% or more, 65% or more, 70% or more, 75% or more, 80 or more, 85% or more, 90% or more, or 95% or more in the entire pore of the metal foam have a pore size of 100 μm or less, as the metal foam. In another example, 55% or more, 60% or more, 65% or more, 70% or more, 75% or more, 80 or more, 85% or more, 90% or more, or 95% or more of the pores may have a pore size of 95 μm or less, 90 μm or less, 85 μm or less, 80 μm or less, 75 μm or less, 70 μm or less, 65 μm or less, 60 μm or less, 55 μm or less, 50 μm or less, 45 μm or less, 40 μm or less, 35 μm or less, 30 μm or less, 25 μm or less, 20 μm or less, or 15 μm or less or so, or may also have a pore size of 0.01 μm or more, 0.05 μm or more, 0.1 μm or more, 0.5 μm or more, 1 μm or more, 3 μm or more, 5 μm or more, 7 μm or more, 9 μm or more, 10 μm or more, 15 μm or more, 20 μm or more, 25 μm or more, 30 μm or more, 35 μm or more, 40 μm or more, 45 μm or more, 50 μm or more, 55 μm or more, 60 μm or more, 65 μm or more, 70 μm or more, 75 μm or more, 80 μm or more, 85 μm or more, 90 μm or more, or 95 μm or more or so. The pores having such a size may also be 100% or less, 95% or less, 90% or less, 85% or less, 80% or less, 75% or less, 70% or less, 65% or less, 60% or less, or 55% or less or so in the entire pore of the metal foam.

The composite material having the desired characteristics can be obtained by compounding the metal foam having the pore size as above with the polymer component.

Here, the pore size of the metal foam is a size when confirmed by the method described in the following examples, which may mean a diameter of a pore when the pore is circular and may mean, when the pore is not circular, a diameter at the time of having been assumed to be a circle having the same area or an average value of the maximum axial length and the minimum axial length measured for the relevant pore. The ratio of the pores is also a ratio relative to the total number of pores to be confirmed when confirmed by the method described in the following examples.

The form of such a metal foam included in the electromagnetic wave shielding film is not particularly limited, but may be a film shape in one example. In the electromagnetic wave shielding film of the present application, a polymer component existing on the surface or inside of the metal foam in the film form is added.

Such a polymer component may form a surface layer on at least one surface of the metal foam, or may be filled and present in the voids inside the metal foam, and may also be optionally filled inside the metal foam while forming the surface layer. When the surface layer is formed, the polymer component may form the surface layer on at least one surface, some surfaces or all surfaces of the metal foam surfaces. In one example, the polymer component may form the surface layer on at least the upper and/or lower surface, which is the main surface of the metal foam. The surface layer may also be formed to cover the entire surface of the metal foam, or may also be formed to cover only a part of the surface.

In electromagnetic wave shielding films, the metal foam may have porosity in a range of about 10% to 99%. The metal foam having this porosity may form a suitable network. In another example, the porosity may be 15% or more, 20% or more, 25% or more, 30% or more, 35% or more, 40% or more, 45% or more, 50% or more, 55% or more, 60% or more, 65% or more, or 70% or more, or may be 98% or less, about 95% or less, about 90% or less, about 85% or less, about 80% less, or about 75% or less or so.

The metal foam may be in the form of a film. In this case, the thickness of the film may be adjusted in consideration of the desired electromagnetic wave shielding ability, thickness ratios, and the like in manufacturing the electromagnetic wave shielding film according to a method to be described below. In order to secure the desired physical properties, the thickness of the film may be, for example, about 10 μm or more, about 20 μm or more, about 30 μm or more, about 40 μm or more, about 45 μm or more, about 50 μm or more, about 55 μm or more, about 60 μm or more, about 65 μm or more or about 70 μm or more, 75 μm or more, 80 μm or more, 85 μm or more, 90 μm or more, 95 μm or more, 100 μm or more, 105 μm or more, 110 μm or more or 115 μm or more, 120 μm or more, 130 μm or more, 140 μm or more, 150 μm or more, 160 μm or more, 170 μm or more, 180 μm or more, 190 μm or more, 200 μm or more, 210 μm or more, 220 μm or more, 230 μm or more, 240 μm or more, 250 μm or more, 260 μm or more, 270 μm or more, 280 μm or more, 290 μm or more, or 300 μm or more. For example, the upper limit of the thickness of the film is controlled according to the purpose, which is not particularly limited, but may be, for example, about 1,000 μm or less, about 900 μm or less, about 800 μm or less, about 700 μm or less, about 600 μm or less, about 500 μm or less, about 400 μm or less, about 300 μm or less, about 200 μm or less, or about 150 μm or less or so.

In this specification, when the thickness of the relevant subject is not constant, the thickness may be a minimum thickness, a maximum thickness or an average thickness of the subject.

The skeleton of the metal foam may be composed of various kinds of metals or metal alloys, where a suitable material may be selected from these metals or metal alloys. Such a material can be exemplified by any one metal selected from the group consisting of copper, gold, silver, aluminum, nickel, iron, cobalt, magnesium, molybdenum, tungsten and zinc, or an alloy of two or more of the foregoing, and the like, but is not limited to.

Such metal foams are variously known, and various methods for producing a metal foam are also known. In the present application, theses known metal foams or metal foams produced by the known methods can be applied.

As the method for producing a metal foam, a method of sintering a composite material of a pore-forming agent such as a salt, and a metal, a method of coating a metal on a support such as a polymer foam and sintering the metal in such a state or a slurry method, and the like is known, and all these methods can be applied to the present application.

In one example, the method for producing the metal foam applied in the present application may comprise a step of sintering a metal foam precursor comprising the metal component. In the present application, the term metal foam precursor means a structure before a process that is performed to form the metal foam, such as the sintering, that is, a structure before the metal foam is produced. Even if the metal foam precursor is referred to as a porous metal foam precursor, it need not necessarily be porous by itself, which may be referred to as a porous metal foam precursor for convenience as long as it can finally form a metal foam as a porous metal structure.

In the present application, the metal foam precursor can be formed using a slurry containing at least a metal component, a dispersant or a solvent, and a binder, where the desired pore characteristics can be efficiently secured through the application of such a slurry.

As the metal component, a metal powder can be applied. An example of the applicable metal powder is determined according to purposes, which is not particularly limited, and a powder of a metal, a powder of a metal alloy or a powder of a mixture of metals, which is capable of forming the above-mentioned metal component, can be applied.

The size of the metal powder is selected in consideration of the desired porosity or pore size, which is not particularly limited, but for example, the average particle diameter of the metal powder may be in a range of about 0.1 µm to about 200 µm. In another example, the average particle diameter may be about 0.5 µm or more, about 1 µm or more, about 2 µm or more, about 3 µm or more, about 4 µm or more, about 5 µm or more, about 6 µm or more, about 7 µm or more, about 8 µm or more, 10 µm or more, 15 µm or more, 20 µm or more, 25 µm or more, 30 µm or more, 35 µm or more, 40 µm or more, 45 µm or more, 50 µm or more, or 55 µm or more. In another example, the average particle diameter may be about 150 µm or less, 100 µm or less, 90 µm or less, 80 µm or less, 70 µm or less, 60 µm or less, 50 µm or less, 40 µm or less, 30 µm or less, or 20 µm or less. As the metal in the metal particles, those having different average particle diameters may be applied. The average particle diameter can be appropriately selected in consideration of the shape of the desired metal foam, for example, the thickness or the porosity of the metal foam.

The average particle diameter of the metal powder referred to in this specification is a so-called median particle diameter, also referred to as D50 particle diameter. This median particle diameter can be obtained by a known particle size analysis method.

The ratio of the metal component (metal powder) in the slurry is not particularly limited, which can be selected in consideration of the desired viscosity, process efficiency, and the like. In one example, the ratio of the metal component in the slurry may be 0.5% to 95% or so based on weight, but is not limited thereto. In another example, the ratio may be about 1% or more, about 1.5% or more, about 2% or more, about 2.5% or more, about 3% or more, about 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, or 80% or more, or may be about 90% or less, about 85% or less, about 80% or less, about 75% or less, about 70% or less, about 65% or less, 60% or less, 55% or less, 50% or less, 45% or less, 40% or less, 35% or less, 30% or less, 25% or less, 20% or less, 15% or less, 10% or less, or 5% or less or so.

The metal foam precursor may be formed by using a slurry comprising a dispersant or a solvent and a binder together with the metal powder.

As the dispersant or solvent, for example, an alcohol may be applied. As the alcohol, a monohydric alcohol with 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol or terpineol, or a dihydric alcohol with 1 to 20 carbon atoms such as ethylene glycol, propylene glycol, hexanediol, octanediol or pentanediol, or a higher polyhydric alcohol, and the like may be used, but the kind is not limited to the above. In addition, as the other solvent, an appropriate solvent may be used in consideration of the solubility of the metal component and the binder to be described below, where a solvent having a dielectric constant in a range of about 10 to 120 may be used and in another example, the dielectric constant may be about 20 or more, about 30 or more, about 40 or more, about 50 or more, about 60 or more, or about 70 or more, or may be about 110 or less, about 100 or less, or about 90 or less. Such a solvent can be exemplified by water or an alcohol with 1 to 8 carbon atoms such as ethanol, butanol or methanol, DMSO (dimethyl sulfoxide), DMF (dimethylformamide) or NMP (N-methylpyrrolidinone), and the like, or an ester-based solvent such as alkyl isobutyrate having an alkyl group with 1 to 20 carbon atoms, 1 to 16 carbon atoms, 1 to 12 carbon atoms, 1 to 8 carbon atoms or 1 to 4 carbon atoms, such as IBIB (isobutyl isobutyrate), and the like, but is not limited thereto.

In a suitable example, a mixed solvent of the alcohol and the ester-based solvent may also be used as the solvent or dispersant. In this case, for example, about 1 to 100 parts by weight of the ester-based solvent may be used relative to 100 parts by weight of the alcohol. In another example, the ratio of the ester-based solvent may be 3 parts by weight or more, 5 parts by weight or more, 7 parts by weight or more, 9 parts by weight or more, or 11 parts by weight or more, or may be 90 parts by weight or less, 80 parts by weight or less, 70 parts by weight or less, 60 parts by weight or less, 50 parts by weight or less, 40 parts by weight or less, 30 parts by weight or less, or 20 parts by weight or less or so.

The slurry may further comprise a binder. The kind of such a binder is not particularly limited, which may be appropriately selected depending on the kind of the metal component, solvent, or dispersant applied upon producing the slurry. For example, the binder can be exemplified by alkylcellulose having an alkyl group with 1 to 8 carbon atoms such as methylcellulose or ethylcellulose, polyalkylene carbonate having an alkylene unit with 1 to 8 carbon atoms such as polypropylene carbonate or polyethylene carbonate, or a polyvinyl alcohol-based binder such as polyvinyl alcohol or polyvinyl acetate (hereinafter, may also be referred to as a polyvinyl alcohol compound), and the like, but is not limited thereto.

The ratio of each component in the slurry is not particularly limited. Such a ratio can be adjusted in consideration of the process efficiency such as coating property and moldability at the time of performing the process using the slurry.

For example, the binder may be contained in the slurry in a ratio of about 1 to 500 parts by weight relative to 100 parts by weight of the above-described metal component in order to more effectively ensure pore characteristics such as the desired porosity. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, about 9 parts by weight or more, about 10 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 200 parts by weight or more, or about 250 parts by weight or more, and may be about 450 parts by weight or less, about 400 parts by weight or less, about 350 parts by weight or less, about 300 parts by weight or less, about 250 parts by weight or less, about 200 parts by weight or less, about 150 parts by weight or less, about 100 parts by weight or less, about 50 parts by weight or less, about 40 parts by weight or less, about 30 parts by weight or less, about 20 parts by weight or less, about 10 parts by weight or less, about 8 parts by weight or less, or about 6 parts by weight or less or so.

The dispersant or solvent in the slurry may be contained in a ratio of about 0.5 to 2,000 parts by weight relative to 100 parts by weight of the binder in order to more effectively secure the desired pore characteristics. In another example, the ratio may be about 1 part by weight or more, about 1.5 parts by weight or more, about 5 parts by weight or more, about 10 parts by weight or more, about 15 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 200 parts by weight or more, about 300 parts by weight or more, about 400 parts by weight or more, about 500 parts by weight or more, about 550 parts by weight or more, about 600 parts by weight or more, or about 650 parts by weight or more, and may be about 1,800 parts by weight or less, about 1,600 parts by weight or less, about 1,400 parts by weight or less, 1,200 parts by weight or less or about 1,000 parts by weight or less, about 900 parts by weight or less, about 800 parts by weight or less, about 700 parts by weight or less, about 600 parts by weight or less, about 500 parts by weight or less, about 400 parts by weight or less, about 300 parts by weight or less, about 200 parts by weight or less, about 150 parts by weight or less, about 130 parts by weight or less, about 110 parts by weight or less, about 100 parts by weight or less, about 50 parts by weight or less, about 30 parts by weight or less, about 20 parts by weight or less, about 10 parts by weight or less, or about 5 parts by weight or less.

Unless otherwise specified, the unit weight part herein means a weight ratio between the respective components.

The slurry may also further comprise necessary known additives in addition to the above-mentioned components. However, in order to effectively obtain the desired pore characteristics, the slurry may not contain a so-called foaming agent. The term foaming agent includes components which can exhibit a foaming effect in relation to other components in the slurry, as well as components commonly referred to in the industry as blowing agents other. Therefore, in the present application, the foaming process may not proceed during the process of manufacturing the metal foam.

The kinds of the additional components that can be included in the slurry vary, but a representative example can be exemplified by polymer beads serving as a pore-forming agent. These polymer beads are present in the slurry, and then form pores in the regions existing in the slurry while being removed in the sintering process or the like. The kind of the applicable polymer beads is not particularly limited, where beads capable of being removed in the sintering process (for example, polymer beads having a melting point of the sintering temperature or less), and having an average particle diameter suitable for the desired pore size, may be used.

In addition, the slurry may also further comprise additives known to be capable of serving as a so-called leveling agent.

The method of forming the metal foam precursor using the slurry is not particularly limited. In the field of manufacturing metal foams, various methods for forming metal foam precursors are known, and in the present application, all these methods can be applied. For example, the metal foam precursor can be formed by maintaining the slurry in a suitable template, or by coating the slurry in an appropriate manner.

It may be advantageous to apply a coating process when producing metal foams in the form of films or sheets according to one example of the present application, especially when producing metal foams in the form of thin films or sheets. For example, after the slurry is coated on a suitable base material to form a precursor, the desired metal foam can be formed through a sintering process to be described below.

The shape of such a metal foam precursor is determined according to the desired metal foam and is not particularly limited. In one example, the metal foam precursor may be in the form of a film or sheet. For example, when the precursor is in the form of a film or sheet, the thickness may be 2,000 µm or less, 1,500 µm or less, 1,000 µm or less, 900 µm or less, 800 µm or less, 700 µm or less, 600 µm or less, 500 µm or less, 400 µm or less, 300 µm or less, 200 µm or less, 150 µm or less, about 100 µm or less, about 90 µm or less, about 80 µm or less, about 70 µm or less, about 60 µm or less, or about 55 µm or less. The metal foams have generally brittle characteristics due to their porous structural features, thereby being difficultly manufactured in the form of films or sheets, particularly thin films or sheets and having a problem of being easily broken even when they are manufactured. However, according to the method of the present application, it is possible to form a metal foam, in which pores are uniformly formed therein, while having a thin thickness, and having excellent mechanical characteristics.

Here, the lower limit of the thickness of the precursor is not particularly limited. For example, the precursor in the form of a film or sheet may also have a thickness of about 5 µm or more, 10 µm or more or about 15 µm or more, 20 µm or more, 25 µm or more, 30 µm or more, 35 µm or more, 40 µm or more, 45 µm or more, 50 µm or more, 55 µm or more, 60 µm or more, 65 µm or more, 70 µm or more, or 75 µm or more or so.

A suitable drying process may also be performed during the process of forming the metal foam precursor. For example, the metal foam precursor may also be formed by molding the slurry by the above-mentioned coating method or the like and then drying it for a certain time. The conditions of the drying are not particularly limited, which can be controlled, for example, at a level where the solvent contained in the slurry can be removed to a desired level. For example, the drying may be performed by maintaining the molded slurry at a temperature in a range of about 50° C. to 250° C., about 70° C. to 180° C., or about 90° C. to 150° C. for an appropriate period of time. The drying time can also be selected in an appropriate range.

The metal foam precursor formed in this manner can be sintered to produce a metal foam. In this case, the method of performing the sintering for producing the metal foam is not particularly limited, and a known sintering method can be applied. That is, the sintering can be performed in such a manner that an appropriate amount of heat is applied to the metal foam precursor in an appropriate manner.

In this case, the sintering conditions can be controlled such that the metal powder is connected to form a porous structure in consideration of the state of the applied metal foam precursor, for example, the composition of the slurry or the kind of the metal powder, and the like, and specific conditions are not particularly limited.

For example, the sintering can be performed by maintaining the precursor at a temperature in a range of about 500° C. to 2000° C., in a range of 700° C. to 1500° C. or in a range of 800° C. to 1200° C., and the holding time can also be selected optionally. In one example, the holding time may be in a range of about 1 minute to 10 hours or so, but is not limited thereto.

As described above, the electromagnetic wave shielding film further comprises a polymer component existing on the surface of the metal foam or inside the metal foam, where the ratio (T/MT) of the total thickness (T) to the thickness (MT) of the metal foam in such an electromagnetic wave shielding film may be 2.5 or less. In another example, the thickness ratio may be about 2 or less, about 1.9 or less, about 1.8 or less, about 1.7 or less, about 1.6 or less, 1.5 or less, 1.4 or less, 1.3 or less, 1.2 or less, 1.15 or less, or 1.1 or less. The lower limit of the thickness ratio is not particularly limited, but in one example, it may be about 1 or more, about 1.01 or more, about 1.02 or more, about 1.03 or more, about 1.04 or more or about 1.05 or more, about 1.06 or more, about 1.07 or more, about 1.08 or more, about 1.09 or more, about 1.1 or more, about 1.11 or more, about 1.12 or more, about 1.13 or more, about 1.14 or more, about 1.15 or more, about 1.16 or more, about 1.17 or more, about 1.18 or more, about 1.19 or more, about 1.2 or more, about 1.21 or more, about 1.22 or more, about 1.23 or more, about 1.24 or more, or about 1.25 or more. An electromagnetic wave shielding film having excellent processability or impact resistance, and the like can be provided, while securing the desired electromagnetic wave shielding ability under such a thickness ratio.

The kind of the polymer component contained in the electromagnetic wave shielding film is not particularly limited, which can be selected in consideration of, for example, processability, impact resistance, insulating properties, and the like of the electromagnetic wave shielding film. In the present application, an example of the applicable polymer component may include one or more selected from the group consisting of a known acrylic resin, a silicone resin, an epoxy resin, a urethane resin, an amino resin and a phenol resin, but is not limited thereto.

In the case of an electromagnetic wave shielding film, desired physical properties can be secured through the application of the metal foam.

In one example, the ratio (MV/PV) of the volume (MV) of the metal foam to the volume (PV) of the polymer component included in the electromagnetic wave shielding film may be 10 or less. In another example, the ratio (MV/PV) may be 9 or less, 8 or less, 7 or less, 6 or less, 5 or less, 4 or less, 3 or less, 2 or less, 1 or less, or 0.5 or less or so. The lower limit of the volume ratio is not particularly limited, which may be, for example, about 0.1 or so. The volume ratio can be calculated through the weights of the polymer component and the metal foam included in the electromagnetic wave shielding film, and the densities of the relevant components.

The present application also relates to a method for producing an electromagnetic wave shielding film in the above form. The manufacturing method may comprise a step of curing a curable polymer composition in a state where the polymer composition is present on the surface of or inside the metal foam.

The details of the metal foam applied in the above method are as described above, and the details of the electromagnetic wave shielding film to be manufactured may also follow the above-described contents.

Here, the applied polymer composition is not particularly limited, as long as it can form the above-mentioned polymer component through curing or the like. Such a polymer component is variously known in the industry.

That is, for example, the electromagnetic wave shielding film can be produced by using a material having an appropriate viscosity among known components and curing it through a known method.

Such an electromagnetic wave shielding film can be applied to various applications, and in one example, it can be applied to various devices (for example, electronic products, etc.) which need to shield generated electromagnetic waves. Accordingly, the present application also relates to the device to which such an electromagnetic wave shielding film is applied. Such a device may comprise, for example, an electromagnetic wave generating source; and the electromagnetic wave shielding film installed so as to be capable of shielding the electromagnetic waves generated from the electromagnetic wave generating source. Here, the type of the electromagnetic wave generating source and the configuration of the device are not particularly limited. That is, in the industry, structures causing electromagnetic waves or designs of devices for shielding the same, and the like are known and most of the existing shielding means applied for shielding the electromagnetic waves are in the form of films or sheets, so that the device can be manufactured by easily applying the electromagnetic wave shielding film of the present application in accordance with these known methods.

Advantageous Effects

The present application can provide an electromagnetic wave shielding film having excellent mechanical strength, flexibility, electrical insulation properties, bonding properties with other constituents, oxidation and high-temperature stability and the like, while having excellent electromagnetic shielding ability.

BRIEF DESCRIPTION OF DRAWINGS

FIG. 1 is a photograph of the copper foam produced in an example.

MODE FOR INVENTION

Hereinafter, the present application will be described in detail by way of examples and comparative examples, but the scope of the present application is not limited to the following examples.

1. Method of Confirming Electromagnetic Wave Shielding Efficiency

The electromagnetic wave shielding efficiency of the electromagnetic wave shielding films manufactured in Examples and the like was confirmed by using Keysight as a network analyzer and Electro-matrices as a measuring jig when conforming to ASTM-D4935 standard and using Anritsu as a measuring instrument and an analysis tool from Keycom as a measuring jig in the case of ASTM-ES7 standard.

2. Method of Confirming Pore Size

The pore size of the applied metal foam was confirmed by photographing the metal foam at a magnification of 500 times using an electronic optical microscope (SEM, JEOL, JSM-7610F), and when the pore was not circular, the major axis and the minor axis were each measured and then averaged to be taken as the pore size.

Example 1

The metal foam was a copper metal foam, where the copper foam, in which the porosity was about 70% or so and about 90% or more of the pores identified by the above method had a pore size of 10 μm, was used. This metal foam was produced in the following manner. 130 g of the copper powder having an average particle diameter (median particle diameter, D50 particle diameter) of about 60 μm, 110 g of texanol, 14 g of isobutyl isobutyrate, 6 g of ethylcellulose and 2 g of a leveling agent (ACME Co., Ltd., Surfadol 338) were mixed to prepare a slurry. The slurry was coated in the form of a film having a thickness of 350 μm or so, dried in an oven at 120° C. for 30 minutes, and then sintered at a temperature of 1,000° C. or so in a hydrogen/argon atmosphere for about 2 hours to produce the metal foam.

FIG. 1 is a photograph of the copper foam applied in Example 1. The copper metal foam was immersed in a thermosetting silicone resin (Dow Corning, PDMS) and an excess amount of the composition was removed using a film applicator such that the final electromagnetic wave shielding film had a thickness of about 400 μm or so. Subsequently, the material was kept in an oven at about 120° C. for about 1 hour or so and cured to produce an electromagnetic wave shielding film. The electromagnetic wave shielding efficiency of the electromagnetic wave shielding film confirmed by the above method was about 95 dB or more at 100 kHz to 3 GHz and about 85 dB or more at 1.5 to 18 GHz.

Example 2

The metal foam was a copper metal foam, where the copper foam, in which the porosity was about 70% or so and about 90% or more of the pores identified by the above method had a pore size of 50 μm, was used. This metal foam was produced in the same manner as in Example 1, except that a slurry prepared by adding 10 g of polymer beads having an average particle diameter (median particle diameter, D50 particle diameter) of about 50 μm as an additional component to the slurry applied in Example 1 was used. A composite material was produced in the same manner as in Example 1 using the metal foam. The electromagnetic wave shielding efficiency of the electromagnetic wave shielding film confirmed by the above method was about 95 dB or more at 100 kHz to 3 GHz and about 85 dB or more at 1.5 to 18 GHz.

Example 3

The metal foam was a copper metal foam, where the copper foam, in which the porosity was about 70% or so and about 90% or more of the pores identified by the above method had a pore size of 100 μm, was used. This metal foam was produced in the same manner as in Example 1, except that a slurry prepared by adding 10 g of polymer beads having an average particle diameter (median particle diameter, D50 particle diameter) of about 100 μm as an additional component to the slurry applied in Example 1 was used.

A composite material was produced in the same manner as in Example 1 using the metal foam. The electromagnetic wave shielding efficiency of the electromagnetic wave shielding film confirmed by the above method was about 90 dB or more at 100 kHz to 3 GHz and about 75 dB or more at 1.5 to 18 GHz.

Example 4

The metal foam was a copper metal foam, where the copper foam having a thickness of about 80 μm or so and a porosity of about 70% or so was used. The copper metal foam was immersed in a thermosetting silicone resin (Dow Corning, PDMS) and an excess amount of the composition was removed using a film applicator such that the final electromagnetic wave shielding film had a thickness of about 110 μm or so. Subsequently, the material was kept in an oven at about 120° C. for about 1 hour or so and cured to produce an electromagnetic wave shielding film. The EMI efficiency of the electromagnetic wave shielding film was about 85 to 95 dB (30 to 1500 MHz).

Example 5

The metal foam was a copper metal foam, where the copper foam having a thickness of about 90 μm or so and a porosity of about 70% or so was used. The copper metal foam was immersed in a thermosetting silicone resin (Dow Corning, PDMS), and an excessive amount of the composition was removed using a film applicator such that the final electromagnetic wave shielding film had a thickness of about 120 μm or so. Subsequently, the material was kept in an oven at about 120° C. for about 1 hour or so and cured to produce an electromagnetic wave shielding film. The EMI efficiency of the electromagnetic wave shielding film was about 95 to 105 dB (30 to 1500 MHz).

Example 6

The metal foam was a copper metal foam, where the copper foam having a thickness of about 120 μm or so and a porosity of about 70% or so was used. The copper metal foam was immersed in a thermosetting silicone resin (Dow Corning, PDMS) and an excess amount of the composition was removed using a film applicator such that the final electromagnetic wave shielding film had a thickness of about 150 μm or so. Subsequently, the material was kept in an oven at about 120° C. for about 1 hour or so and cured to produce an electromagnetic wave shielding film. The EMI efficiency of the electromagnetic wave shielding film was about 100 to 110 dB (30 to 1500 MHz).

Example 7

The metal foam was a nickel metal foam, where the copper foam having a thickness of about 60 μm or so and a porosity of about 60% or so was used. The copper metal foam was immersed in a thermosetting silicone resin (Dow Corning, PDMS) and an excess amount of the composition was removed using a film applicator such that the final electromagnetic wave shielding film had a thickness of about 90 μm or so. Subsequently, the material was kept in an oven at about 120° C. for about 1 hour or so and cured to produce an electromagnetic wave shielding film. The EMI efficiency of the electromagnetic wave shielding film was about 70 to 80 dB (30 to 1500 MHz).

Comparative Example 1

The metal foam was a copper metal foam, where the copper foam, in which the porosity was about 70% or so and about 90% or more of the pores identified by the above method had a pore size of more than 100 μm, was used. This metal foam was produced in the same manner as in Example 1, except that a slurry prepared by adding 10 g of polymer beads having an average particle diameter (median particle diameter, D50 particle diameter) of more than about 100 μm as an additional component to the slurry applied in Example 1 was used. A composite material was produced in the same manner as in Example 1 using the metal foam. The electromagnetic wave shielding efficiency of the electromagnetic wave shielding film confirmed by the above method was about 75 dB at 100 kHz to 3 GHz and about 60 dB at 1.5 to 18 GHz.

Comparative Example 2

Copper powder (average diameter of about 20 μm) was mixed with a thermosetting silicone resin (Dow Corning, PDMS) in an amount of about 10 vol % or so, molded into a film form having a thickness of about 150 μm or so by a film applicator, and kept in an oven at about 120° C. for about 1 hour or so and cured to produce an electromagnetic wave shielding film. The EMI efficiency of the electromagnetic wave shielding film was about 0 dB (30 to 1500 MHz).

Comparative Example 3

Copper powder (average diameter of about 20 μm) was mixed with a thermosetting silicone resin (Dow Corning, PDMS) in an amount of about 30 vol % or so, molded into a film form having a thickness of about 150 μm or so by a film applicator, and kept in an oven at about 120° C. for about 1 hour or so and cured to produce an electromagnetic wave shielding film. The EMI efficiency of the electromagnetic wave shielding film was about 0 dB (30 to 1500 MHz).

Comparative Example 4

Nickel powder (average diameter of about 20 μm) was mixed with a thermosetting silicone resin (Dow Corning, PDMS) in an amount of about 10 vol % or so, molded into a film form having a thickness of about 150 μm or so by a film applicator, and kept in an oven at about 120° C. for about 1 hour or so and cured to produce an electromagnetic wave shielding film. The EMI efficiency of the electromagnetic wave shielding film was about 0 dB (30 to 1500 MHz).

Comparative Example 5

Nickel powder (average diameter of about 20 μm) was mixed with a thermosetting silicone resin (Dow Corning, PDMS) in an amount of about 30 vol % or so, molded into a film form having a thickness of about 150 μm or so by a film applicator, and kept in an oven at about 120° C. for about 1 hour or so and cured to produce an electromagnetic wave shielding film. The EMI efficiency of the electromagnetic wave shielding film was about 0 dB (30 to 1500 MHz).

Comparative Example 6

A copper foil was immersed in a thermosetting silicone resin (Dow Corning, PDMS), molded into a film form having a thickness of about 130 μm or so by a film applicator, and kept in an oven at about 120° C. for about 1 hour or so and cured to produce an electromagnetic wave shielding film. The EMI efficiency of the electromagnetic wave shielding film was about 90 to 100 dB (30 to 1500 MHz).

What is claimed is:

1. An electromagnetic wave shielding film, comprising:
a metal foam in the form of a film; and
a polymer component on a surface of the metal foam and inside the metal foam,
wherein 80% or more of total pores in the metal foam have a pore size of 100 μm or less, and
wherein the electromagnetic wave shielding efficiency at 100 kHz to 3 GHz is 85 dB or greater, and an electromagnetic wave shielding efficiency at 1.5 to 18 GHz is 70 dB or greater, as measured in accordance with ASTM D4935 or ASTM ES7 standard.

2. The electromagnetic wave shielding film according to claim 1, wherein the electromagnetic wave shielding efficiency at 100 kHz to 3 GHz is 86 dB or greater, and the electromagnetic wave shielding efficiency at 1.5 to 18 GHz is 71 dB or greater, as measured in accordance with ASTM D4935 or ASTM ES7 standard.

3. The electromagnetic wave shielding film according to claim 1, wherein 80% or more of the total pores in the metal foam have a pore size of 95 μm or less.

4. The electromagnetic wave shielding film according to claim 1, wherein 90% or more of the total pores in the metal foam have a pore size of 100 μm or less.

5. The electromagnetic wave shielding film according to claim 1, wherein a ratio (T/MT) of a total thickness (T) of the electromagnetic wave shielding film to a thickness (MT) of the metal foam is 1.01 or greater.

6. The electromagnetic wave shielding film according to claim 1, wherein a ratio (T/MT) of a total thickness (T) of the electromagnetic wave shielding film to a thickness (MT) of the metal foam is 2 or less.

7. The electromagnetic wave shielding film according to claim 1, wherein the metal foam has a thickness of 10 μm or greater.

8. The electromagnetic wave shielding film according to claim 1, wherein the metal foam has a porosity in a range of 10 to 99%.

9. The electromagnetic wave shielding film according to claim 1, wherein the metal foam has a skeleton comprising one or more metals selected from the group consisting of copper, gold, silver, aluminum, nickel, iron, cobalt, magnesium, molybdenum, tungsten and zinc, or two or more of the foregoing.

10. The electromagnetic wave shielding film according to claim 1, wherein the polymer component forms a surface layer on the surface of the metal foam.

11. The electromagnetic wave shielding film according to claim 1, wherein the polymer component comprises one or more resins selected from the group consisting of an acrylic resin, a silicone resin, an epoxy resin, a urethane resin, an amino resin and a phenol resin.

12. The electromagnetic wave shielding film according to claim 1, wherein a ratio (MV/PV) of a volume (MV) of the metal foam to a volume (PV) of the polymer component is 10 or less.

13. A device, comprising:
an electromagnetic wave generating source; and
the electromagnetic wave shielding film of claim 1 configured to shield electromagnetic waves generated from the electromagnetic wave generating source.

14. A method of producing an electromagnetic wave shielding film, the method comprising:
forming a metal foam from a slurry that comprises a metal powder and polymer beads, wherein the metal foam is in the form of a film;
applying a curable polymer composition on a surface of and/or inside the metal foam; and
curing the curable polymer composition on the surface of and/or inside the metal foam to form a polymer component on the surface of and/or inside the metal foam, thus forming the electromagnetic wave shielding film.

15. A method of producing an electromagnetic wave shielding film, the method comprising:
providing a metal foam in a form of a film;
immersing the metal foam into the curable polymer composition so that the curable polymer composition is on a surface of and/or inside the metal foam; and
removing a portion of the curable polymer composition using a film applicator; and
curing the curable polymer composition on the surface of and/or inside the metal foam to form a polymer component on the surface of and/or inside the metal foam, thus forming the electromagnetic wave shielding film.

\* \* \* \* \*